(12) United States Patent
Marimuthu et al.

(10) Patent No.: US 9,029,193 B2
(45) Date of Patent: May 12, 2015

(54) SEMICONDUCTOR DEVICE AND METHOD OF FORMING AN INTERCONNECT STRUCTURE FOR 3-D DEVICES USING ENCAPSULANT FOR STRUCTURAL SUPPORT

(75) Inventors: Pandi Chelvam Marimuthu, Singapore (SG); Nathapong Suthiwongsunthorn, Singapore (SG); Kock Liang Heng, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 873 days.

(21) Appl. No.: 12/775,170

(22) Filed: May 6, 2010

(65) Prior Publication Data
US 2010/0221873 A1  Sep. 2, 2010

Related U.S. Application Data

(63) Continuation of application No. 12/332,118, filed on Dec. 10, 2008, now Pat. No. 7,741,148.

(51) Int. Cl.
| | |
|---|---|
| *H01L 21/44* | (2006.01) |
| *H01L 23/31* | (2006.01) |
| *H01L 21/48* | (2006.01) |
| *H01L 21/56* | (2006.01) |
| *H01L 23/538* | (2006.01) |
| *H01L 25/065* | (2006.01) |
| *H01L 25/00* | (2006.01) |

(52) U.S. Cl.
CPC .......... *H01L 23/3128* (2013.01); *H01L 21/486* (2013.01); *H01L 21/561* (2013.01); *H01L 23/3121* (2013.01); *H01L 23/5384* (2013.01); *H01L 23/5385* (2013.01); *H01L 25/0655* (2013.01); *H01L 25/50* (2013.01); *H01L 2224/73265* (2013.01); *H01L 2924/01004* (2013.01); *H01L 2924/01046* (2013.01); *H01L 2924/01077* (2013.01); *H01L 2924/01078* (2013.01); *H01L 2924/01079* (2013.01); *H01L 2924/09701* (2013.01); *H01L 2924/13091* (2013.01); *H01L 2924/1433* (2013.01); *H01L 2924/19041* (2013.01); *H01L 2924/01322* (2013.01)

(58) Field of Classification Search
None
See application file for complete search history.

(56) References Cited

U.S. PATENT DOCUMENTS 5,497,033 A * 3/1996 Fillion et al. ................. 257/723
6,002,169 A * 12/1999 Chia et al. ..................... 257/697

(Continued)

*Primary Examiner* — Kyoung Lee
(74) *Attorney, Agent, or Firm* — Robert D. Atkins; Patent Law Group Atkins and Associates, P.C.

(57) ABSTRACT

A semiconductor device has a first interconnect structure formed over a first side of a substrate. A semiconductor die is mounted to the first interconnect structure. An encapsulant is deposited over the semiconductor die and first interconnect structure for structural support. A portion of a second side of the substrate, opposite the first side of the substrate, is removed to reduce its thickness. The encapsulant maintains substrate robustness during thinning process. A TSV is formed through the second side of the substrate to the first interconnect structure. A second interconnect structure is formed in the TSV. The TSV has a first insulating layer formed over the second side of the substrate and first conductive layer formed over the first insulating layer and into the TSV. The second interconnect structure has a second conductive layer formed over the first conductive layer in an area away from the TSV.

23 Claims, 10 Drawing Sheets

(56) References Cited

U.S. PATENT DOCUMENTS

| | | | |
|---|---|---|---|
| 6,841,883 B1* | 1/2005 | Farnworth et al. | 257/777 |
| 6,882,045 B2* | 4/2005 | Massingill et al. | 257/724 |
| 2002/0180013 A1* | 12/2002 | Brofman et al. | 257/678 |
| 2007/0077747 A1* | 4/2007 | Heck et al. | 438/618 |
| 2008/0079164 A1* | 4/2008 | Kurita et al. | 257/759 |
| 2009/0085190 A1* | 4/2009 | Simon et al. | 257/698 |
| 2009/0212420 A1* | 8/2009 | Hedler et al. | 257/737 |

* cited by examiner

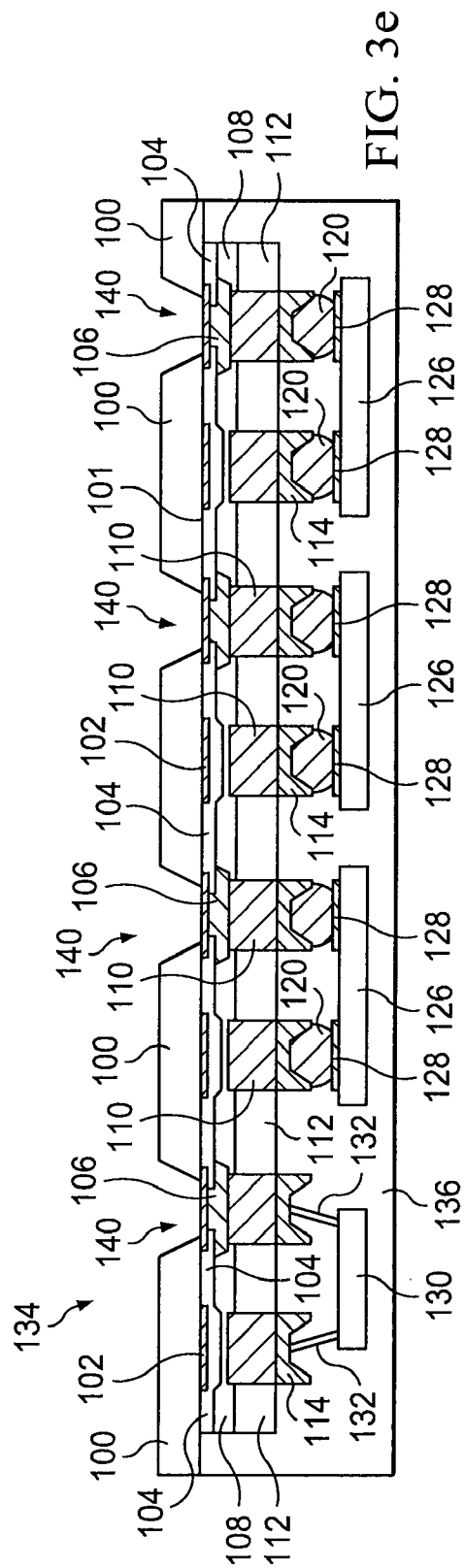
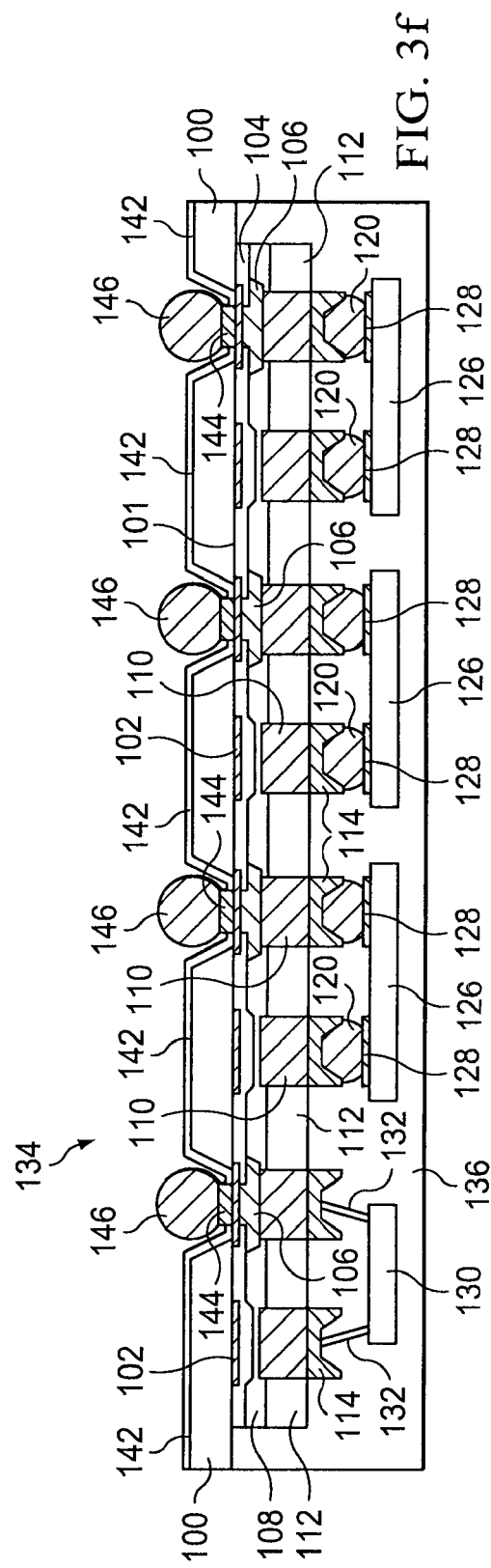

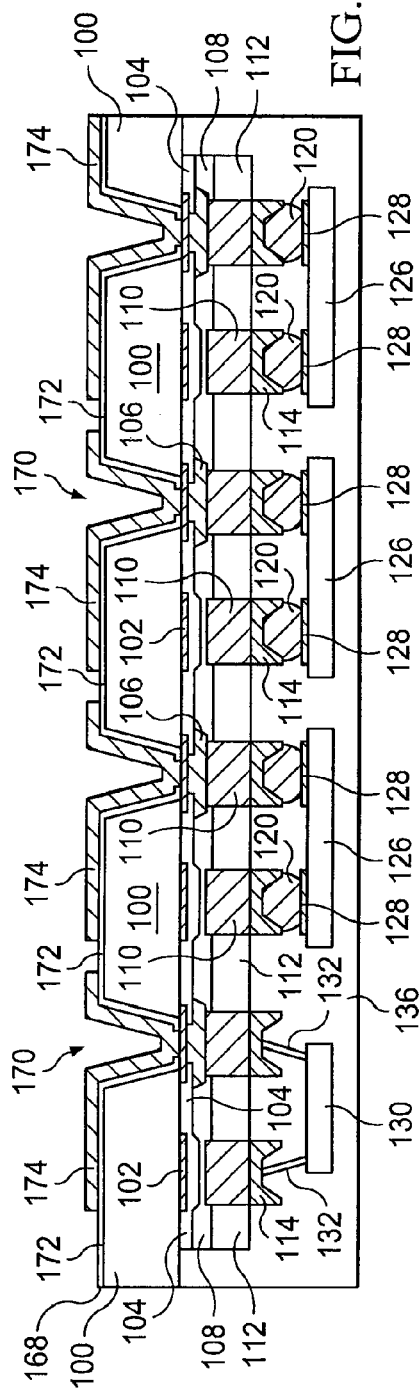
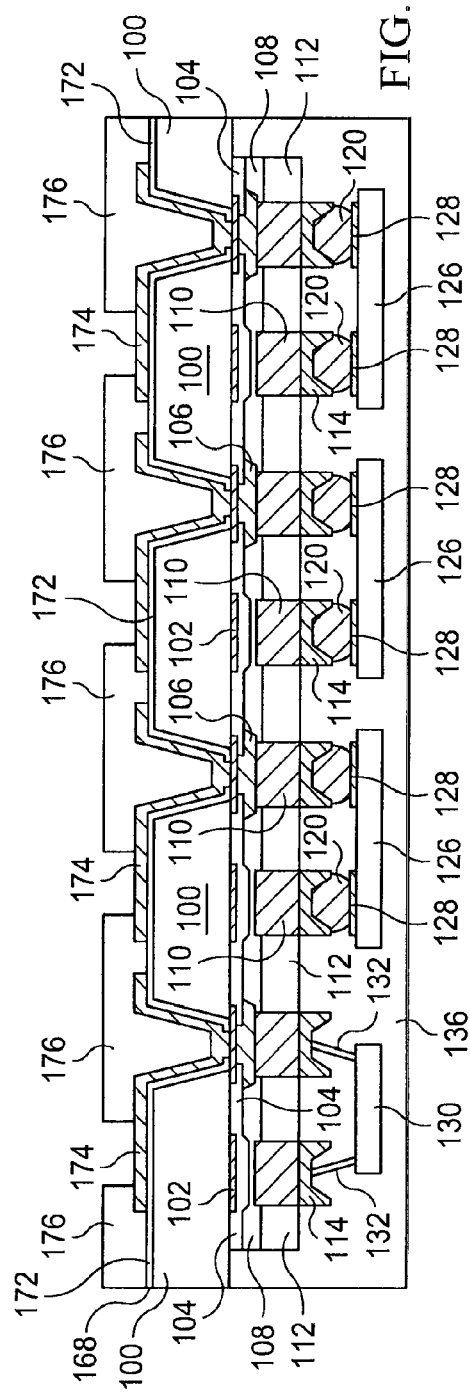
FIG. 5a
FIG. 5b

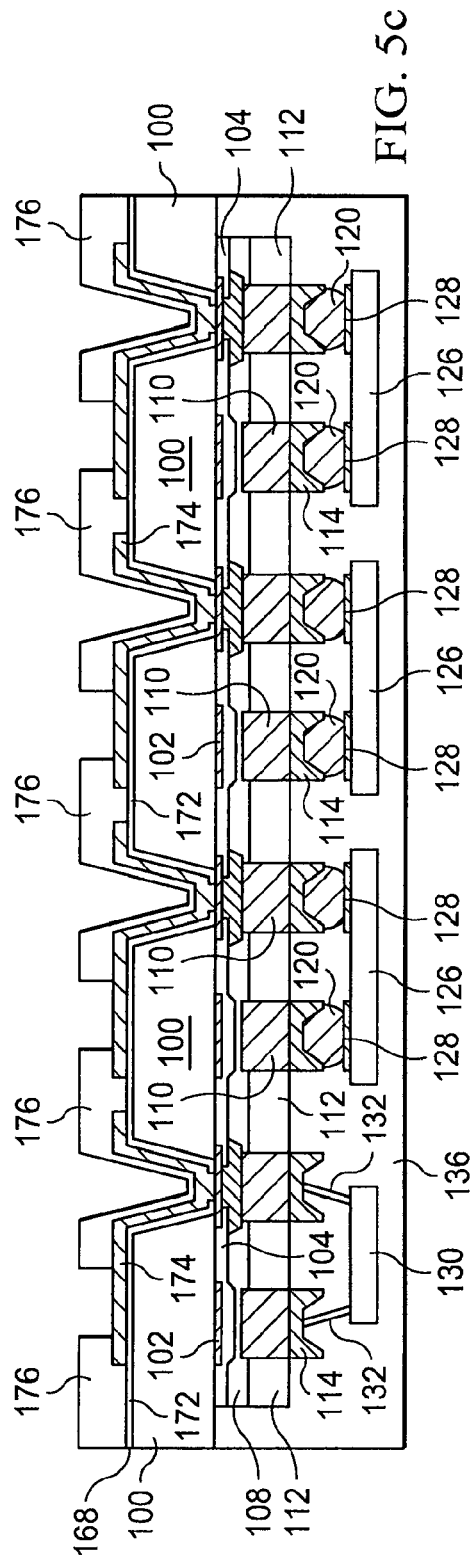
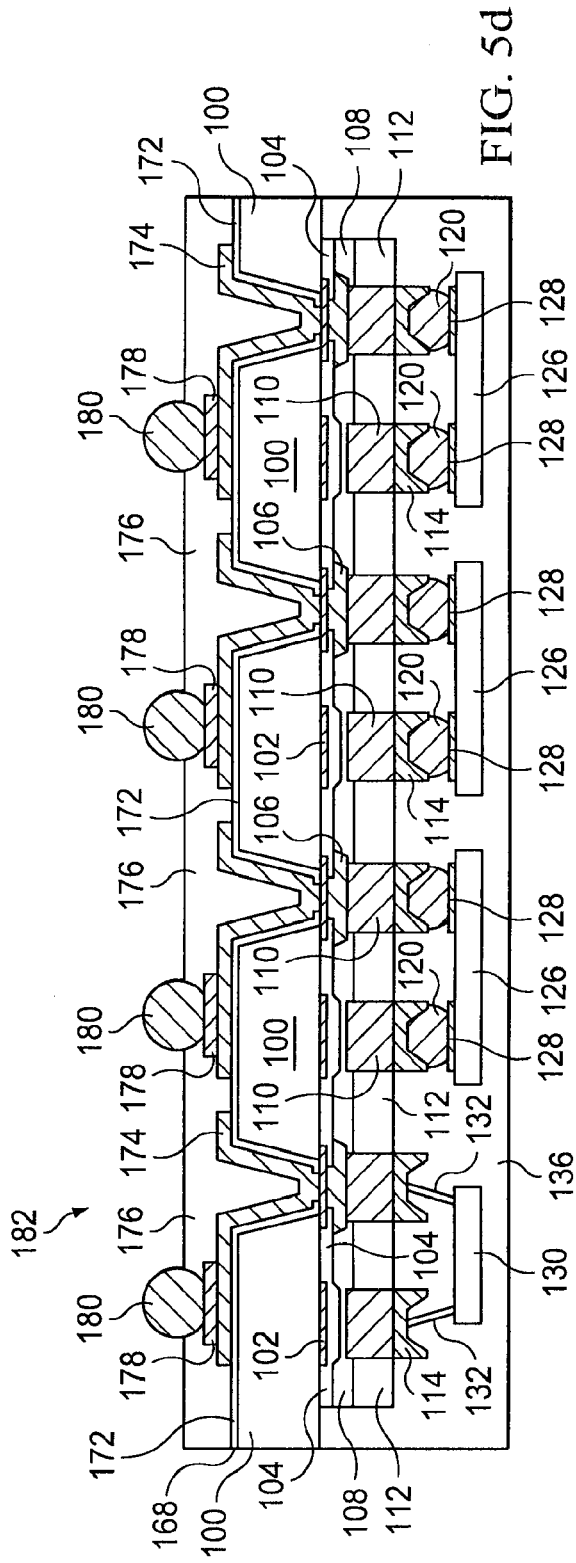

US 9,029,193 B2

SEMICONDUCTOR DEVICE AND METHOD OF FORMING AN INTERCONNECT STRUCTURE FOR 3-D DEVICES USING ENCAPSULANT FOR STRUCTURAL SUPPORT

CLAIM TO DOMESTIC PRIORITY

The present application is a continuation of U.S. patent application Ser. No. 12/332,118, now U.S. Pat. No. 7,741,148, filed Dec. 10, 2008, and claims priority to the foregoing parent application pursuant to 35 U.S.C. §120.

FIELD OF THE INVENTION

The present invention relates in general to semiconductor devices and, more particularly, to a process of forming an interconnect structure for three-dimensional (3-D) devices using an encapsulant for structural support.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between the semiconductor package containing semiconductor devices on multiple levels (3-D device integration) and an external printed circuit board (PCB) or substrate is typically accomplished with wire bonds, through hole vias (THV), or through silicon vias (TSV). Wire bonds require additional package area to form the bend in the leads. To make electrical interconnect using THVs or TSVs, a temporary carrier is bonded to the package substrate for structural support while forming the THVs and TSVs. For thin wafers, e.g., less than 250 micrometers ($\mu$m), excessive handling can lead to breakage and slippage. The temporary carrier adds manufacturing costs. The bonding material for the temporary carrier limits processing temperatures to about 200° C.

SUMMARY OF THE INVENTION

A need exists to provide interconnect for 3-D semiconductor devices. Accordingly, in one embodiment, the present invention is a method of making a semiconductor device comprising the steps of providing a substrate, forming a first interconnect structure over a first surface of the substrate, mounting a semiconductor die or component to the first interconnect structure, depositing an encapsulant over the semiconductor die or component and first interconnect structure, removing a portion of the substrate to reduce thickness of the substrate, forming a via through a second surface of the substrate, opposite the first surface of the substrate, to the first interconnect structure, conformally applying a first insulating layer over a sidewall of the via, and forming a second interconnect structure in the via.

In another embodiment, the present invention is a method of making a semiconductor device comprising the steps of providing a substrate, forming a first interconnect structure over a first surface of the substrate, mounting a semiconductor die or component to the first interconnect structure, depositing an encapsulant over the semiconductor die or component and first interconnect structure, forming a via through a second surface of the substrate, opposite the first surface of the substrate, to the first interconnect structure, and forming a second interconnect structure in the via.

In another embodiment, the present invention is a method of making a semiconductor device comprising the steps of providing a substrate, forming a first interconnect structure over a first surface of the substrate, mounting a semiconductor die or component to the first interconnect structure, depositing an encapsulant over the semiconductor die or component and first interconnect structure, forming a via formed through a second surface of the substrate, opposite the first surface of the substrate, to the first interconnect structure, conformally applying a first insulating layer over a sidewall of the via, and forming a first conductive layer over the first insulating layer in the via.

In another embodiment, the present invention is a method of making a semiconductor device comprising the steps of providing a substrate, forming a first interconnect structure over a first surface of the substrate, mounting a semiconductor die or component to the first interconnect structure, depositing an encapsulant over the semiconductor die or component and first interconnect structure, forming a via through a second surface of the substrate, opposite the first surface of the substrate, to the first interconnect structure, and forming a first conductive layer over a sidewall of the via.

BRIEF DESCRIPTION OF THE DRAWINGS

FIGS. 3a-3g illustrate a process of forming an interconnect structure for 3-D devices involving partial removal of the substrate and formation of TSVs using encapsulant for structural support;

FIGS. 5a-5e illustrate another process of forming an interconnect structure for 3-D devices involving partial removal of the substrate and formation of TSVs using encapsulant for structural support.

DETAILED DESCRIPTION OF THE DRAWINGS

Figure 1:
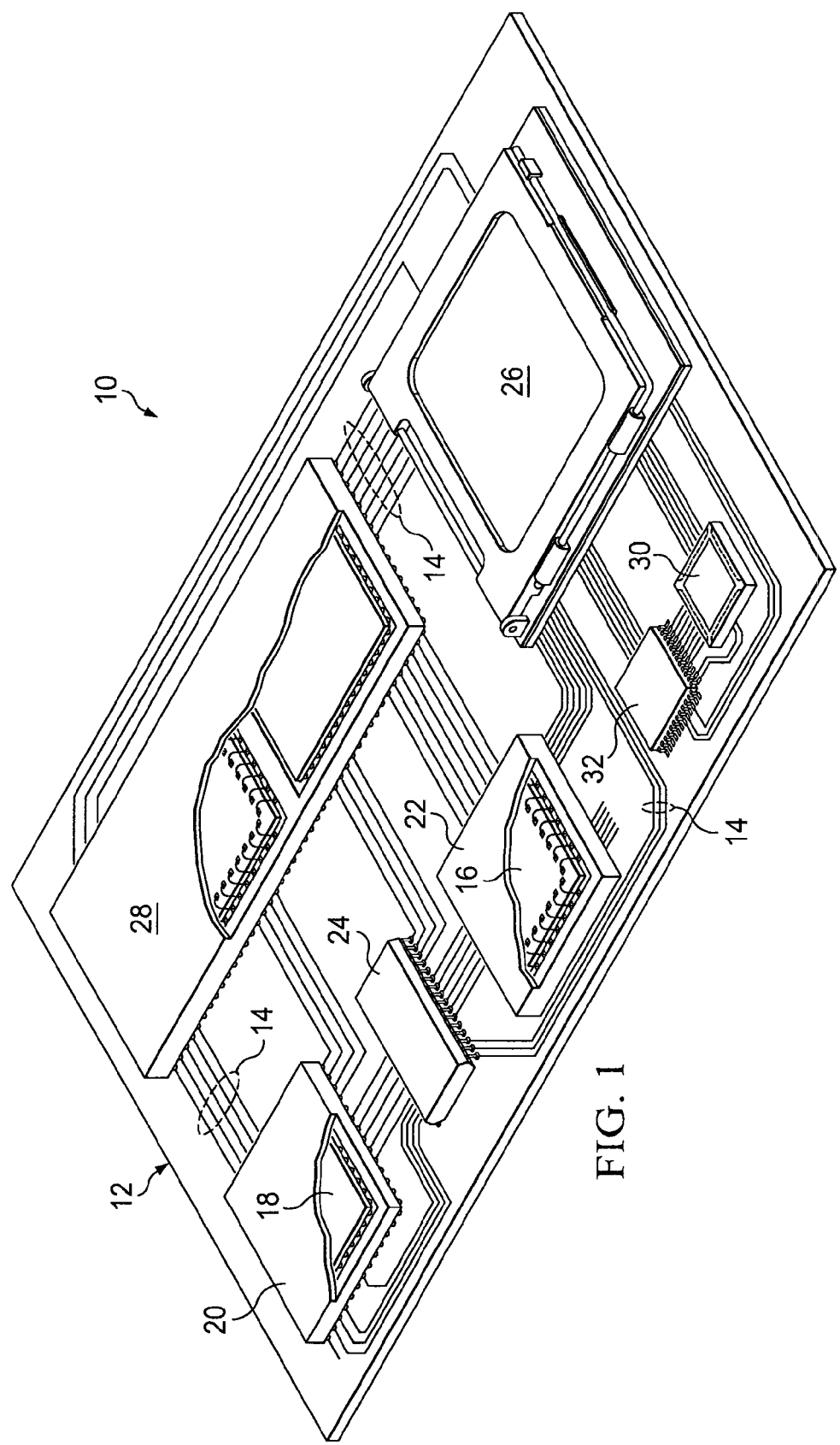
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
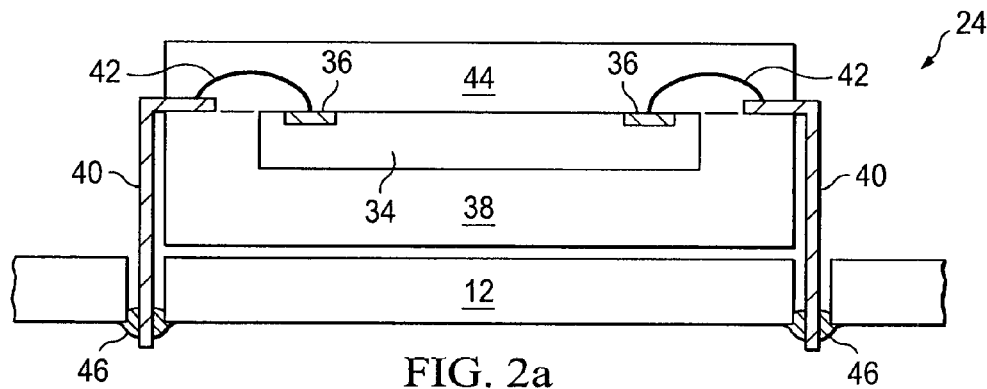
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
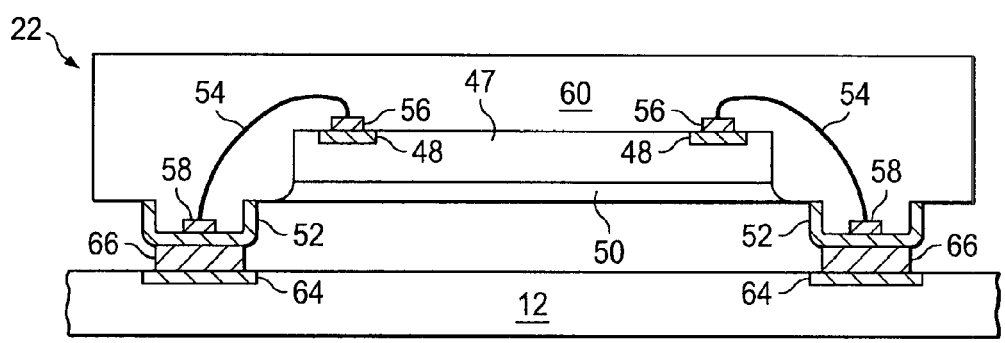

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
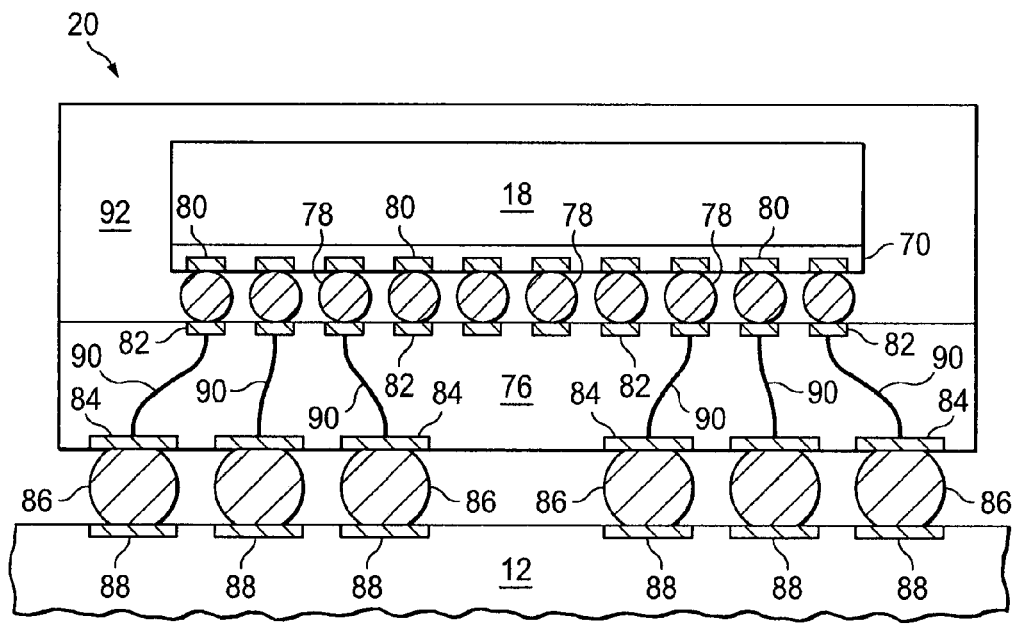

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
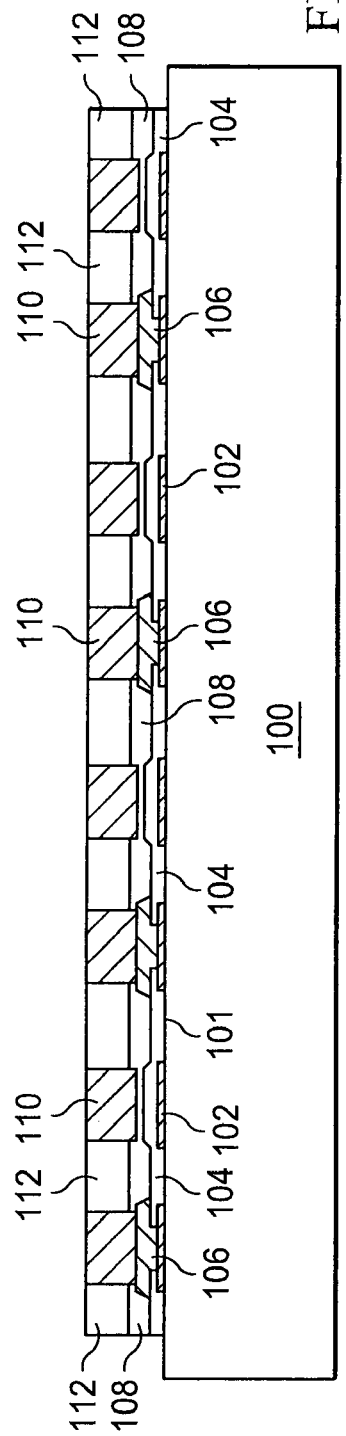

FIGS. 3a-3g illustrate a process of forming an interconnect structure for 3-D devices using an encapsulant for structural support during formation of additional interconnect structures. In FIG. 3a, a substrate or wafer 100 contains dummy or sacrificial base material such as silicon (Si), polymer, polymer composite, metal, ceramic, glass, glass epoxy, beryllium oxide, or other suitable low-cost, rigid material or bulk semiconductor material for structural support. Alternatively, substrate 100 can be other semiconductor base materials such as germanium, gallium arsenide, indium phosphide, or silicon carbide. A plurality of semiconductor die is formed on substrate 100 using semiconductor manufacturing processes described above. Each semiconductor die contains analog or digital circuits formed in active region 101. The semiconductor die may also contain IPD, such as inductors, capacitors, and resistors, in or above active region 101.

The IPDs contained within substrate 100 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

An electrically conductive layer 102 is formed on substrate 100 using a patterning and deposition process to form individual portions or sections. The individual portions of conductive layer 102 can be electrically common or electrically isolated depending on the connectivity of the semiconductor device. Conductive layer 102 can be Al, Cu, Sn, Ni, Au, Ag, or other suitable electrically conductive material. The deposition of conductive layer 102 uses PVD, CVD, electrolytic plating, or electroless plating process.

An insulating or passivation layer 104 is formed on conductive layer 102 and active surface 101 of substrate 100. The insulating layer 102 can be silicon dioxide ($SiO_2$), silicon nitride ($Si_3N_4$), silicon oxynitride (SiON), tantalum pentoxide ($Ta_2O_5$), zircon ($ZrO_2$), aluminum oxide ($Al_2O_3$), polyimide, benzocyclobutene (BCB), polybenzoxazoles (PBO), or other material having similar insulating and structural properties. The insulating layer 104 is deposited using PVD, CVD, printing, spin coating, spray coating, sintering or thermal oxidation. The insulating layer 104 can be single or multiple layers. A portion of insulating layer 104 is removed by an etching process to expose conductive layer 102.

An electrically conductive layer 106 is deposited on the exposed portion of conductive layer 102 using PVD, CVD, evaporation, electrolytic plating, electroless plating, or other suitable metal deposition process. Conductive layer 106 can be Al, Cu, Sn, Ni, Au, Ag, tungsten (W), or other suitable electrically conductive material. Conductive layer 106 is an under bump metallization (UBM) in electrical contact with conductive layer 102. UBMs 106 can be a multi-metal stack with adhesion layer, barrier layer, and seed or wetting layer. The adhesion layer is formed over conductive layer 102 and can be titanium (Ti), or titanium nitride (TiN), titanium tungsten (TiW), Al, or chromium (Cr). The barrier layer is formed over the adhesion layer and can be made of Ni, NiV, platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between conductive layer 102 and subsequent solder bumps or other interconnect structure. UBMs 106 provide a low resistive interconnect to conductive layer 102, as well as a barrier to solder diffusion and seed layer for solder wettability.

An insulating or passivation layer 108 is formed on insulating layer 104 and conductive layer 106. The insulating layer 108 can be $SiO_2$, $Si_3N_4$, SiON, $Ta_2O_5$, $ZrO_2$, $Al_2O_3$, polyimide, BCB, PBO, or other material having similar insulating and structural properties. The insulating layer 108 is deposited using PVD, CVD, printing, spin coating, spray coating, sintering or thermal oxidation. The insulating layer 108 can be single or multiple layers. A portion of insulating layer 108 is removed by an etching process to expose conductive layer 106.

Conductive pillars or posts 110 are formed over conductive layer 106. Conductive pillars 110 can be Cu, Al, W, Au, solder, or other suitable electrically conductive material. In one embodiment, the conductive pillars 110 can be Cu and formed by a plating process. A thick layer of photoresist is deposited over insulating layer 108 and conductive layer 106. The photoresist can be a liquid or a dry film with a thickness of 50 to 125 μm. Two layers of photoresist may be applied to achieve the desired thickness. In one embodiment, conductive pillars have a height of 2 μm to 120 μm. The photoresist is patterned using photolithography. Cu is deposited in the patterned areas of the photoresist using electrolytic plating. The photoresist is stripped away leaving behind individual conductive pillars 110. In another embodiment, conductive pillars 110 can be replaced with solder balls or stud bumps.

An insulating or passivation layer 112 is formed around conductive pillars 110. The insulating layer 112 can be $SiO_2$, $Si_3N_4$, SiON, $Ta_2O_5$, $ZrO_2$, $Al_2O_3$, polyimide, BCB, PBO, or other material having similar insulating and structural properties. The insulating layer 112 is deposited using PVD, CVD, printing, spin coating, spray coating, sintering or thermal oxidation. The insulating layer 112 can be single or multiple layers.

Figure 3B:
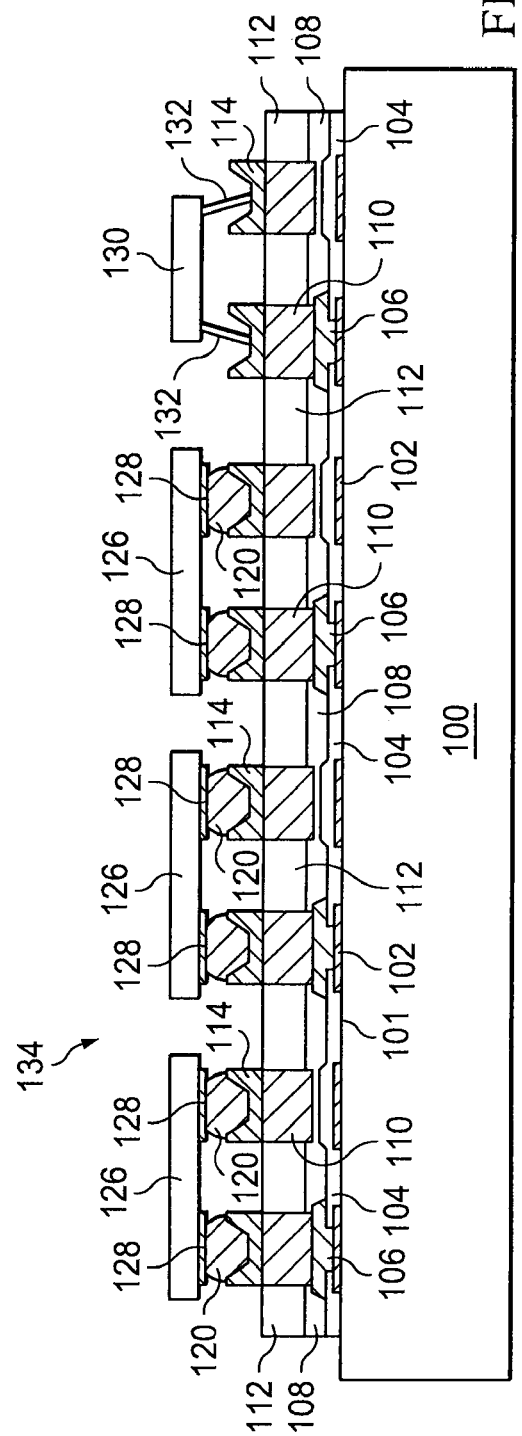

In FIG. 3b, an electrically conductive layer 114 is deposited on conductive pillar 110 using PVD, CVD, evaporation, electrolytic plating, electroless plating, or other suitable metal deposition process. Conductive layer 114 can be Al, Cu, Sn, Ni, Au, Ag, W, or other suitable electrically conductive material. Conductive layer 114 is a UBM in electrical contact with conductive pillar 110. UBMs 114 can be a multi-metal stack with adhesion layer, barrier layer, and seed or wetting layer. The adhesion layer is formed over conductive pillar 110 and can be Ti, TiN, TiW, Al, or Cr. The barrier layer is formed over the adhesion layer and can be made of Ni, NiV, platinum Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive pillar 110 and subsequent solder bumps or other interconnect structure. UBMs 114 provide a low resistive interconnect to conductive pillar 110, as well as a barrier to solder diffusion and seed layer for solder wettability.

An electrically conductive solder material is deposited over UBM 114 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 120. In some applications, solder bumps 120 are reflowed a second time to improve electrical contact to UBM 114. Solder bumps 120 represent one type of interconnect structure that can be formed on UBM 114. The interconnect structure can also use bond wires, 3-D interconnects, conductive paste, stud bump, micro bump, or other electrical interconnect.

Semiconductor die 126 each having contact pads 128 are metallurgically and electrically connected to solder bumps 120. Likewise, passive device or component 130 is structurally and electrically connected to UBM 114 using bonds 132. Semiconductor die 126 and passive device 130, in combination with the IPD formed in active region 101, provides a 3-D structure.

Figure 3C:
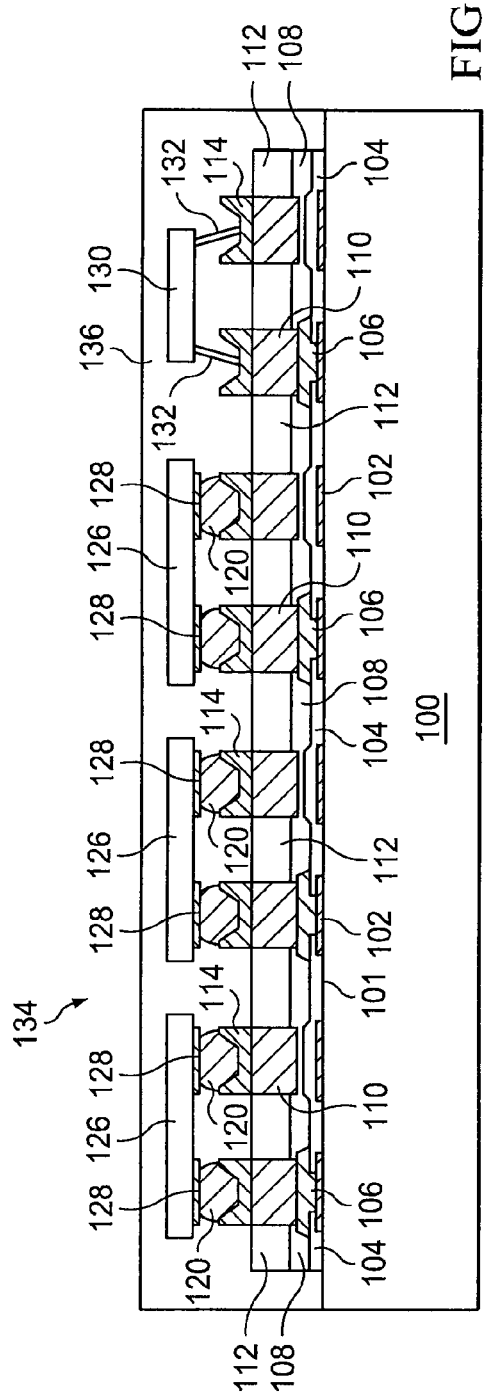

The resulting semiconductor device 134 is encapsulated to protect the device and provide robust structural support during formation of additional interconnect structures. FIG. 3c shows an encapsulant or molding compound 136 deposited over the structure described in FIG. 2d using a paste printing, compressive molding, transfer molding, liquid encapsulant molding, or other suitable applicator. Encapsulant 136 can be epoxy resin, epoxy acrylate, polymer, or polymer composite material. Encapsulant 136 is non-conductive and environmentally protects the semiconductor device from external elements and contaminants.

Figure 3D:
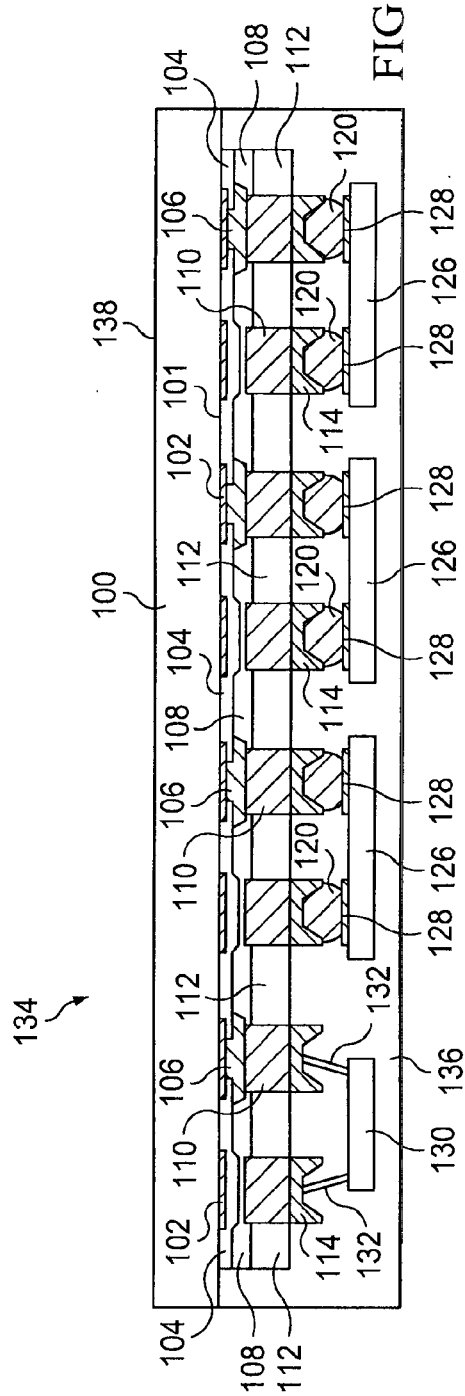

In FIG. 3d, semiconductor device 134 is inverted and back surface 138 undergoes back grinding by mechanical grinding, CMP, wet etching, dry etching, plasma etching, or another thinning process. Since substrate 100 is covered with encapsulant 136, the structure is sufficiently robust to reduce substrate thickness to 10-50 micrometers (μm). Encapsulant 136 provides the support to maintain the structural integrity of the device, even with the reduced substrate thickness. In other embodiments, substrate 100 can be reduced to 30-300 μm in thickness.

In FIG. 3e, substrate 100 is patterned and etched using a photoresist layer on back surface 138 to form through silicon vias (TSV) 140 over conductive layer 102 using infrared (IR) alignment. TSVs 140 can be formed by etching or laser drilling to have a tapered or vertical geometry. TSVs 140 extend to conductive layer 102.

In FIG. 3f, an insulating layer 142 is conformally applied over back surface 138 using a patterning and deposition process. The insulating layer 142 covers the back surface 138 and further follows the contour of TSV 140. The insulating layer 142 can be Si3N4, SiO2, SiON, Ta2O5, ZnO, ZrO2, Al2O3, or other suitable insulating material. The deposition of insulating layer 142 may involve CVD, PVD, spin coating, printing, or molding process. A portion of insulating layer 142 is removed using an etching process to expose conductive layer 102.

An electrically conductive layer 144 is deposited on conductive layer 102 using PVD, CVD, evaporation, electrolytic plating, electroless plating, or other suitable metal deposition process. Conductive layer 144 can be Al, Cu, Sn, Ni, Au, Ag, W, or other suitable electrically conductive material. Conductive layer 144 is a UBM in electrical contact with conductive layer 102. UBMs 144 can be a multi-metal stack with adhesion layer, barrier layer, and seed or wetting layer. The adhesion layer is formed over conductive layer 102 and can be Ti, TiN, TiW, Al, or Cr. The barrier layer is formed over the adhesion layer and can be made of Ni, NiV, platinum Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 102 and subsequent solder bumps or other interconnect structure. UBMs 144 provide a low resistive interconnect to conductive layer 102, as well as a barrier to solder diffusion and seed layer for solder wettability.

Figure 3G:
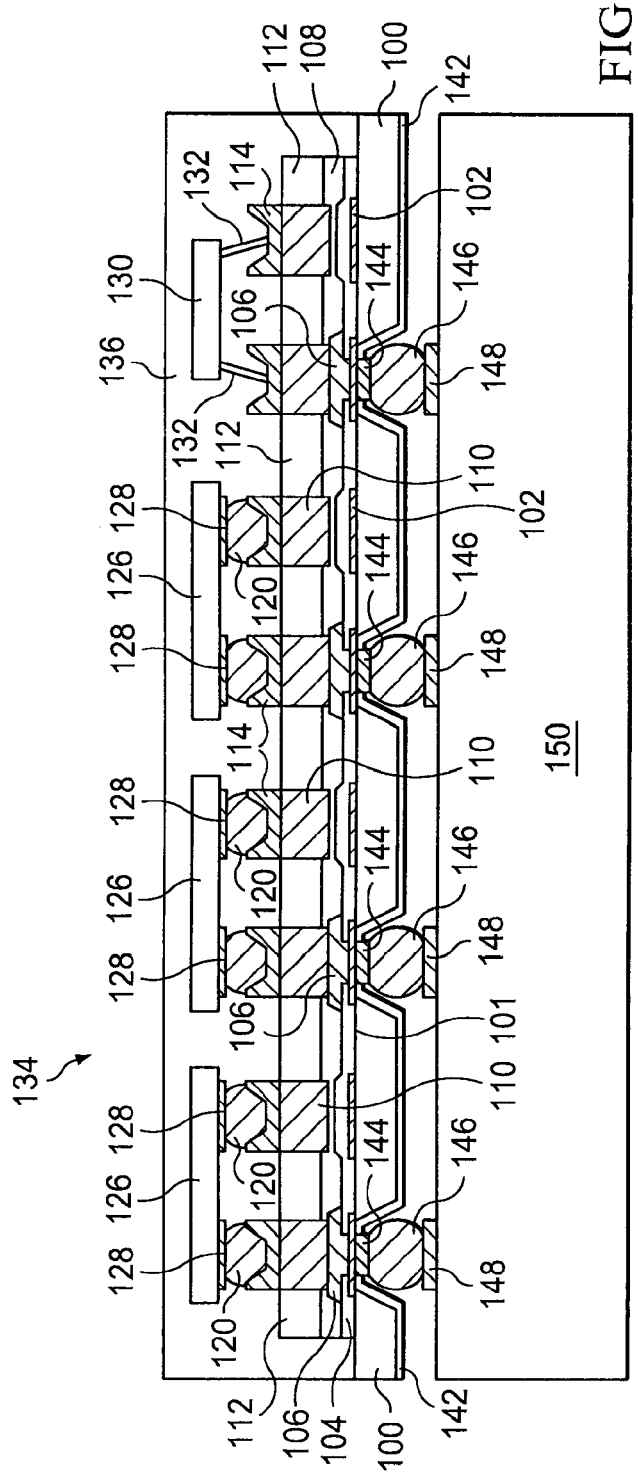

In FIG. 3g, semiconductor device 134 is inverted again and then metallurgically and electrically connected to contact pads 148 on printed circuit board (PCB) 150 using solder bumps 146. Semiconductor die 126 and passive device 130 electrically connect to PCB 150 through solder bumps 120 and 146, UBMs 106, 114, and 144, conductive pillars 110, bonds 132, and conductive layer 102.

Figure 4A:
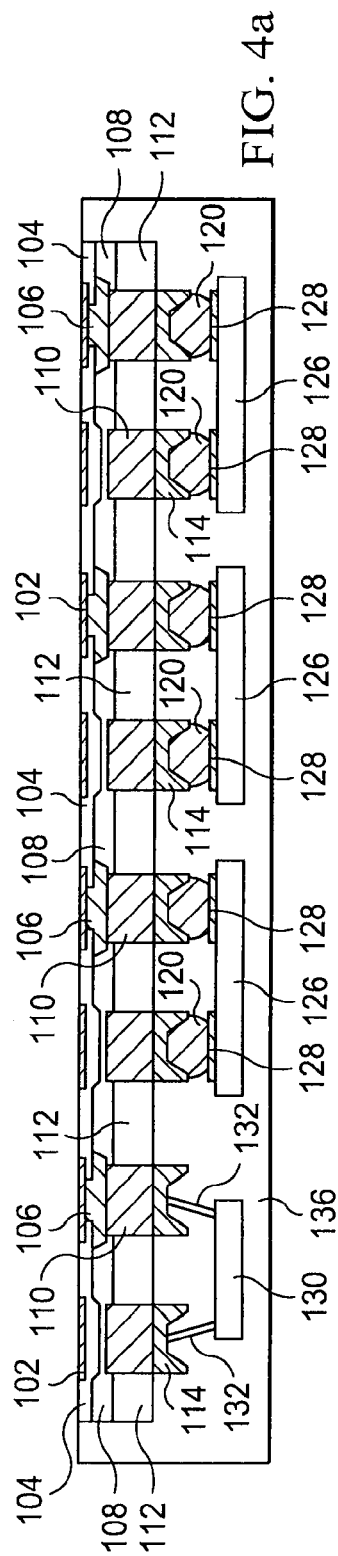
FIGS. 4a-4c illustrate a process of forming an interconnect structure for 3-D devices involving complete removal of the substrate using encapsulant for structural support.

Another embodiment of forming an interconnect structure for 3-D devices using an encapsulant for structural support begins with the structure shown in FIG. 3c. At this point, conductive layer 102, UBMs 106 and 114, conductive pillars 110, solder bumps 120, semiconductor die 126, passive device 130, bonds 132, and insulating layers 104, 108, and 112 have been formed on substrate 100. Encapsulant 136 is deposited over the structure 102-132 for structural support during formation of additional interconnect structures. The structure 102-136 is inverted and substrate 100 is completely removed by mechanical grinding, CMP, wet etching, or dry etching, as shown in FIG. 4a. Encapsulant 136 provides the support to maintain the structural integrity of the device, even without a substrate.

Figure 4B:
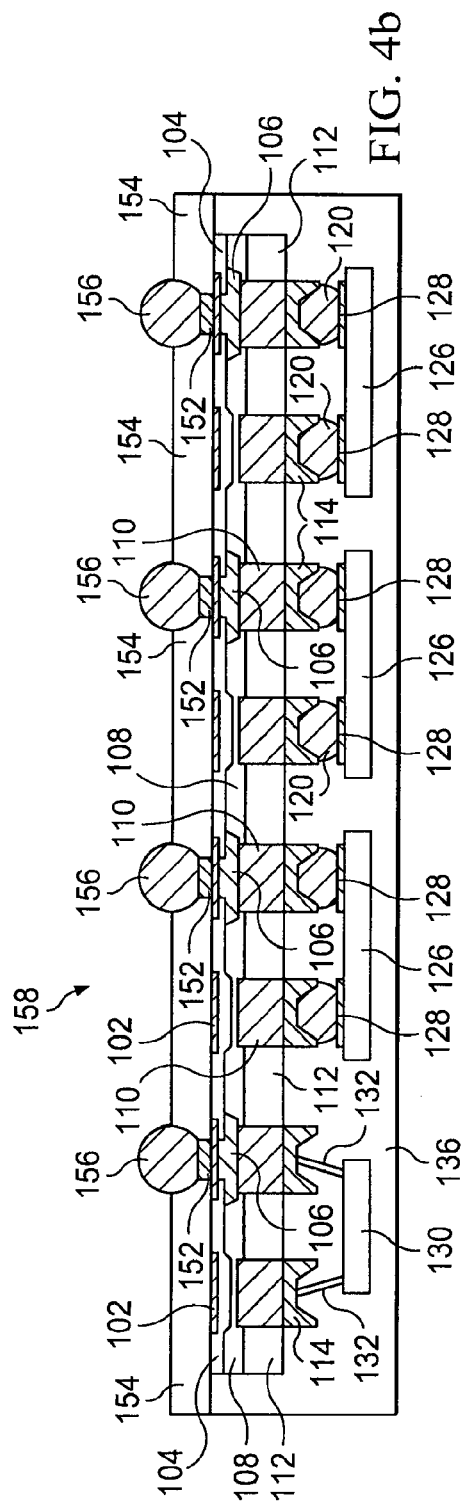

In FIG. 4b, an insulating or passivation layer 154 is formed on insulating layer 104 and conductive layer 102. The insulating layer 154 can be SiO2, Si3N4, SiON, Ta2O5, ZrO2, Al2O3, polyimide, BCB, PBO, or other material having similar insulating and structural properties. The insulating layer 154 is deposited using PVD, CVD, printing, spin coating, spray coating, sintering or thermal oxidation. The insulating layer 154 can be single or multiple layers. A portion of insulating layer 154 is removed by an etching process to expose conductive layer 102.

An electrically conductive layer 152 is deposited on conductive layer 102 using PVD, CVD, evaporation, electrolytic plating, electroless plating, or other suitable metal deposition process. Conductive layer 152 can be Al, Cu, Sn, Ni, Au, Ag, W, or other suitable electrically conductive material. Conductive layer 152 is a UBM in electrical contact with conductive layer 102. UBMs 152 can be a multi-metal stack with adhesion layer, barrier layer, and seed or wetting layer. The adhesion layer is formed over conductive layer 102 and can be Ti, TiN, TiW, Al, or Cr. The barrier layer is formed over the adhesion layer and can be made of Ni, NiV, platinum Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 102 and subsequent solder bumps or other interconnect structure. UBMs 152 provide a low resistive interconnect to conductive layer 102, as well as a barrier to solder diffusion and seed layer for solder wettability.

An electrically conductive solder material is deposited over UBM 152 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 156. In some applications, solder bumps 156 are reflowed a second time to improve electrical contact to UBM 152. Solder bumps 156 represent one type of interconnect structure that can be formed on UBM 152. The interconnect structure can also use bond wires, 3-D interconnects, conductive paste, stud bump, micro bump, or other electrical interconnect.

Figure 4C:
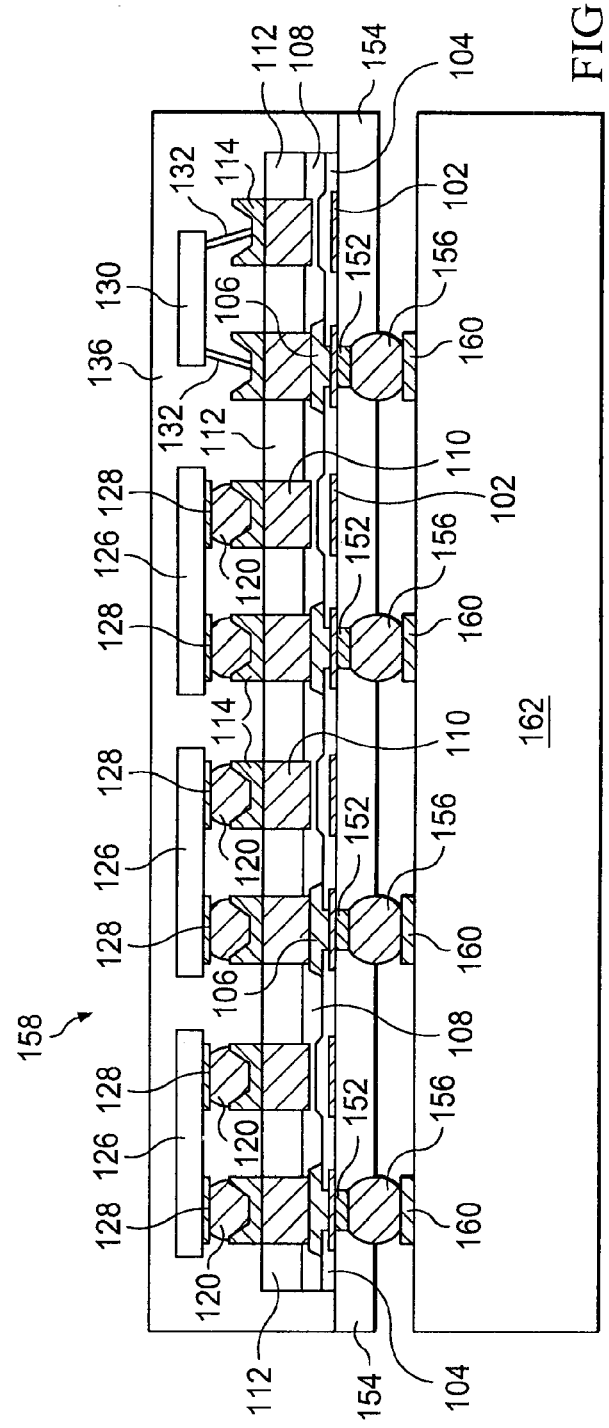

In FIG. 4c, the resulting semiconductor device 158 is inverted again and then metallurgically and electrically connected to contact pads 160 on PCB 162 using solder bumps 156. Semiconductor die 126 and passive device 130 electrically connect to PCB 162 through solder bumps 120 and 156, UBMs 106, 114, and 152, conductive pillars 110, bonds 132, and conductive layer 102.

Another embodiment of forming an interconnect structure for 3-D devices using an encapsulant for structural support begins with the structure shown in FIG. 3d. At this point, conductive layer 102, UBMs 106 and 114, conductive pillars 110, solder bumps 120, semiconductor die 126, passive device 130, bonds 132, and insulating layers 104, 108, and 112 have been formed on substrate 100. Encapsulant 136 is deposited over the structure 102-132 for structural support during formation of additional interconnect structures. The structure 102-136 is inverted and back surface 138 undergoes back grinding to reduce substrate thickness to 30-300 µm. The backgrinding may involve mechanical grinding, CMP, wet etching, dry etching, plasma etching, or another thinning process. Encapsulant 136 provides the support to maintain the structural integrity of the device, even with the reduced substrate thickness.

In FIG. 5a, substrate 100 is patterned and etched using a photoresist layer on back surface 168 to form TSV 170 over conductive layer 102 using IR alignment. TSVs 170 can be formed by etching or laser drilling to have a tapered or vertical geometry. TSVs 170 extend to conductive layer 102.

An insulating layer 172 is conformally applied over back surface 168 using a patterning and deposition process. The insulating layer 172 covers the back surface 168 and further follows the contour of TSV 170. The insulating layer 172 can be Si3N4, SiO2, SiON, Ta2O5, ZnO, ZrO2, Al2O3, or other suitable insulating material. The deposition of insulating layer 172 may involve CVD, PVD, spin coating, spray coating, printing, or molding process. A portion of insulating layer 172 is removed using an etching process to expose conductive layer 102.

An electrically conductive layer 174 is deposited on insulating layer 172 and conductive layer 102 using PVD, CVD, evaporation, electrolytic plating, electroless plating, or other suitable metal deposition process. Conductive layer 174 can be Al, Cu, Sn, Ni, Au, Ag, W, or other suitable electrically conductive material. Conductive layer 174 operates as a redistribution layer (RDL) to extend electrical connection for conductive layer 102.

In FIG. 5b, an insulating or passivation layer 176 is formed on insulating layer 172 and conductive layer 174. The insulating layer 176 can be SiO2, Si3N4, SiON, Ta2O5, ZrO2, Al2O3, polyimide, BCB, PBO, or other material having similar insulating and structural properties. The insulating layer 176 is deposited using PVD, CVD, printing, spin coating, spray coating, sintering or thermal oxidation. FIG. 5c shows insulating layer 176 formed by spray coating. The insulating layer 176 can be single or multiple layers. A portion of insulating layer 176 is removed by an etching process to expose conductive layer 174.

In FIG. 5d, an electrically conductive layer 178 is deposited on conductive layer 174 using PVD, CVD, evaporation, electrolytic plating, electroless plating, or other suitable metal deposition process. Conductive layer 178 can be Al, Cu, Sn, Ni, Au, Ag, W, or other suitable electrically conductive material. Conductive layer 178 is a UBM in electrical contact with conductive layers 174 and 102. UBMs 178 can be a multi-metal stack with adhesion layer, barrier layer, and seed or wetting layer. The adhesion layer is formed over conductive layer 174 and can be Ti, TiN, TiW, Al, or Cr. The barrier layer is formed over the adhesion layer and can be made of Ni, NiV, platinum Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 174 and subsequent solder bumps or other interconnect structure. UBMs 178 provide a low resistive interconnect to conductive layer 174, as well as a barrier to solder diffusion and seed layer for solder wettability.

An electrically conductive solder material is deposited over UBM 178 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 180. In some applications, solder bumps 180 are reflowed a second time to improve electrical contact to UBM 178. Solder bumps 180 represent one type of interconnect structure that can be formed on UBM 178. The interconnect structure can also use bond wires, 3-D interconnects, conductive paste, stud bump, micro bump, or other electrical interconnect.

Figure 5E:
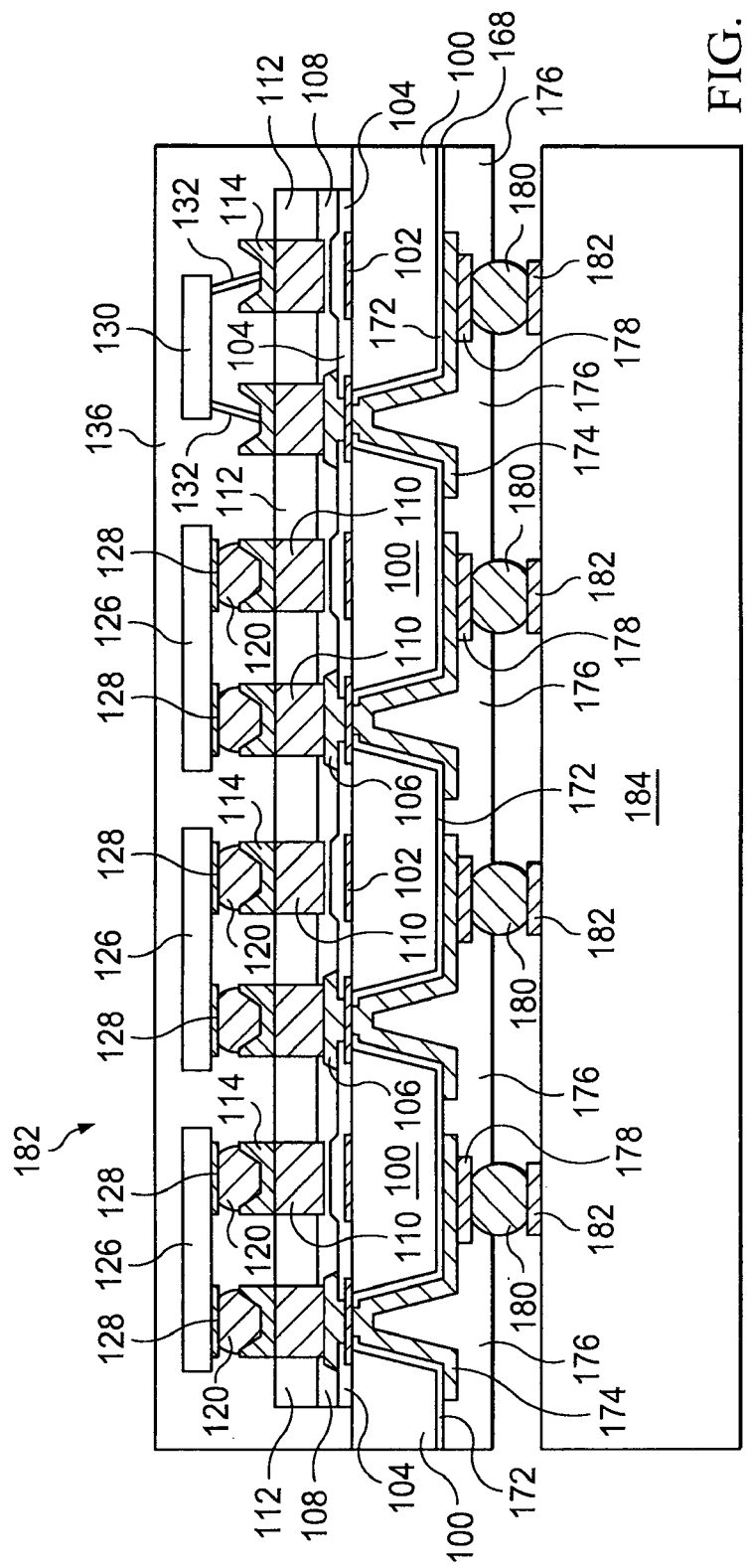

In FIG. 5e, semiconductor device 182 is inverted again and then metallurgically and electrically connected to contact pads 182 on PCB 184 using solder bumps 180. Semiconductor die 126 and passive device 130 electrically connect to PCB 182 through solder bumps 120 and 180, UBMs 106, 114, and 178, conductive pillars 110, bonds 132, and conductive layers 174 and 102.

In summary, the encapsulation process makes the substrate or wafer structurally robust during formation of additional interconnect structures. The encapsulant permits backside grinding to substantially reduce its thickness or completely remove it. A thin substrate simplifies formation of TSVs for electrical connection to the PCB. The encapsulant eliminates the need for bonding & de-bonding to a temporary carrier, lowers manufacturing cost, reduces breakage and slip, simplifies handling, and enables higher processing temperatures. The electrical connection to the PCB on the backside of the substrate reduces silicon area and corresponding package size and thickness.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    forming a first interconnect structure, including a plurality of conductive pillars, over a first surface of the substrate;
    disposing a semiconductor die over the first interconnect structure with bumps electrically connected to the conductive pillars;
    depositing an encapsulant over the semiconductor die and first interconnect structure;
    forming a via through a second surface of the substrate, opposite the first surface of the substrate, to the first interconnect structure; and
    forming a second interconnect structure in the via.

2. The method of claim 1, wherein forming the second interconnect structure includes:
    applying an insulating layer over a sidewall of the via; and
    forming a conductive layer over the insulating layer in the via.

3. The method of claim 1, wherein the via includes a tapered sidewall.

4. The method of claim 1, wherein forming the first interconnect structure includes:
    forming a first conductive layer over the first surface of the substrate;
    forming a first insulating layer over the first conductive layer and substrate;
    forming a second conductive layer over the first insulating layer and first conductive layer;
    forming a second insulating layer over the second conductive layer and first insulating layer;
    forming a conductive pillar over the second conductive layer;
    forming a third insulating layer around the conductive pillar; and
    forming a third conductive layer over the conductive pillar and electrically connecting the third conductive layer to the semiconductor die.

5. The method of claim 1, wherein forming the second interconnect structure further includes forming a bump in the via over the first interconnect structure.

6. The method of claim 1, further including mounting the semiconductor device to a printed circuit board through the second interconnect structure.

7. The method of claim 1, wherein forming the second interconnect structure includes:
    forming an insulating layer over the first interconnect structure; and
    forming a bump over the first interconnect structure.

8. A method of making a semiconductor device, comprising:
    providing a substrate;
    forming a first interconnect structure, including a plurality of conductive pillars, over a first surface of the substrate;
    disposing a semiconductor die over the first interconnect structure with bumps electrically connected to the conductive pillars;
    depositing an encapsulant over the semiconductor die and first interconnect structure;
    forming a via through a second surface of the substrate, opposite the first surface of the substrate, to the first interconnect structure; and
    forming a first conductive layer in the via.

9. The method of claim 8, further including forming a second interconnect structure over the first conductive layer.

10. The method of claim 9, wherein forming the second interconnect structure includes forming a bump in the via over the first conductive layer.

11. The method of claim 8, wherein the via includes a tapered sidewall.

12. The method of claim 8, further including removing a portion of the substrate to reduce a thickness of the substrate.

13. The method of claim 8, wherein forming the first interconnect structure includes:
    forming a second conductive layer over the first surface of the substrate;
    forming a first insulating layer over the second conductive layer and substrate;
    forming a third conductive layer over the first insulating layer and second conductive layer;
    forming a second insulating layer over the third conductive layer and first insulating layer;
    forming a conductive pillar over the third conductive layer;
    forming a third insulating layer around the conductive pillar; and
    forming a fourth conductive layer over the conductive pillar and electrically connecting the third conductive layer to the semiconductor die.

14. The method of claim 8, further including forming an insulating layer over a sidewall of the via.

15. A method of making a semiconductor device, comprising:
    providing a substrate;
    forming a first interconnect structure, including a plurality of conductive pillars, over a first surface of the substrate;
    disposing a semiconductor die over the first interconnect structure;
    depositing an encapsulant over the semiconductor die and first interconnect structure;
    forming a via through a second surface of the substrate, opposite the first surface of the substrate, to the first interconnect structure; and
    forming a first conductive layer over a sidewall of the via.

16. The method of claim 15, further including forming an insulating layer over the sidewall of the via.

17. The method of claim 15, further including forming a second interconnect structure over the first conductive layer.

18. The method of claim 17, wherein forming the second interconnect structure includes forming a bump in the via over the first conductive layer.

19. The method of claim 15, further including removing a portion of the substrate to reduce a thickness of the substrate.

20. The method of claim 15, wherein forming the first interconnect structure includes:
    forming a second conductive layer over the first surface of the substrate;
    forming a first insulating layer over the second conductive layer and substrate;
    forming a third conductive layer over the first insulating layer and second conductive layer;
    forming a second insulating layer over the third conductive layer and first insulating layer;
    forming a conductive pillar over the third conductive layer;

forming a third insulating layer around the conductive pillar; and forming a fourth conductive layer over the conductive pillar and electrically connecting the fourth conductive layer to the semiconductor die.

21. A method of making a semiconductor device, comprising:

providing a substrate;

forming a first interconnect structure over a first surface of the substrate;

disposing a semiconductor die over the first interconnect structure;

depositing an encapsulant over the semiconductor die and extending to the substrate;

forming an opening in the substrate extending to the first interconnect structure; and forming a second interconnect structure over the substrate and into the opening in the substrate to contact the first interconnect structure.

22. The method of claim 21, wherein forming the first interconnect structure includes:

forming a first conductive layer over the first surface of the substrate;

forming a first insulating layer over the first conductive layer and substrate;

forming a second conductive layer over the first insulating layer and first conductive layer;

forming a second insulating layer over the second conductive layer and first insulating layer;

forming a conductive pillar over the second conductive layer;

forming a third insulating layer around the conductive pillar; and forming a third conductive layer over the conductive pillar and electrically connecting the third conductive layer to the semiconductor die.

23. The method of claim 21, wherein forming the second interconnect structure includes:

forming an insulating layer over the first interconnect structure; and forming a bump over the first interconnect structure.

\* \* \* \* \*